United States Patent
Kim et al.

(10) Patent No.: US 10,475,522 B2
(45) Date of Patent: Nov. 12, 2019

(54) MEMORY SYSTEM INCLUDING A DELEGATE PAGE AND METHOD OF IDENTIFYING A STATUS OF A MEMORY SYSTEM

(71) Applicant: SK hynix Inc., Icheon-si, Gyeonggi-do (KR)

(72) Inventors: Donggun Kim, Hwaseong-si (KR); Yong Ju Kim, Seoul (KR); Do Sun Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 52 days.

(21) Appl. No.: 15/821,155

(22) Filed: Nov. 22, 2017

(65) Prior Publication Data

US 2018/0261298 A1 Sep. 13, 2018

(30) Foreign Application Priority Data

Mar. 10, 2017 (KR) ........................ 10-2017-0030849

(51) Int. Cl.
  *G11C 29/00* (2006.01)
  *G11C 29/38* (2006.01)
  *G06F 3/06* (2006.01)
  *G11C 29/36* (2006.01)

(52) U.S. Cl.
  CPC ............ *G11C 29/38* (2013.01); *G06F 3/0619* (2013.01); *G06F 3/0653* (2013.01); *G06F 3/0679* (2013.01); *G11C 29/36* (2013.01); *G11C 2029/3602* (2013.01)

(58) Field of Classification Search
  CPC . G11C 29/38; G11C 29/36; G11C 2029/3602; G06F 3/0679; G06F 3/0619; G06F 3/0653
  See application file for complete search history.

(56) References Cited

U.S. PATENT DOCUMENTS

| 8,219,776 B2 * | 7/2012 | Forhan | G06F 13/14 365/185.33 |
| 2013/0028021 A1 * | 1/2013 | Sharon | G11C 11/5642 365/185.17 |
| 2015/0103593 A1 * | 4/2015 | Su | G11C 16/3422 365/185.02 |

* cited by examiner

*Primary Examiner* — Samir W Rizk
(74) *Attorney, Agent, or Firm* — William Park & Associates Ltd.

(57) ABSTRACT

A nonvolatile memory system may include a nonvolatile memory device, a delegate page attacker, and a health status analyzer. The nonvolatile memory device may include at least one memory block including a plurality of storage pages and a delegate page. The delegate page attacker may be configured to attack a bit of the delegate page at the same corresponding location as a bit of the storage page in which an error occurs. The health status analyzer may be configured to perform write and read operations for the delegate page and analyzes error information occurred in the write and read operations to determine whether the nonvolatile memory device is in a failure status.

21 Claims, 6 Drawing Sheets

MEMORY SYSTEM INCLUDING A DELEGATE PAGE AND METHOD OF IDENTIFYING A STATUS OF A MEMORY SYSTEM

CROSS-REFERENCE TO RELATED APPLICATION

The present application claims priority under 35 U.S.C 119(a) to Korean Patent Application No. 10-2017-0030849, filed on Mar. 10, 2017, which is herein incorporated by reference in its entirety.

BACKGROUND

1. Technical Field

Various embodiments of the present disclosure may generally relate to a memory system and, more particularly, to a memory system including a delegate page and a method of identifying a status of the memory system.

2. Related Art

Nonvolatile random access memory (NVRAM) such as ferroelectric RAM (FRAM), magnetic RAM (MRAM), phase change RAM (PRAM), and the like, are attracting attention as a next generation memory. These memories have power related advantages whereby the power required for driving is very low and access to the memory is possible in units of bytes. These memories also have characteristics of a nonvolatile storage medium. Currently, NAND flash memory is widely used as the nonvolatile memory, but the NAND flash memory has a limit in that read and write operations should be performed in units of pages and an erase operation should be performed in units of blocks. Accordingly, application fields of the nonvolatile memory (NVRAM) in which read and write operations are performed in units of bytes are expected to be expanded more.

However, in such nonvolatile memory (NVRAM), it is generally known that the write endurance, which is an index indicating the number of times of writing, of the nonvolatile memory is poorer than that of a volatile memory, and therefore, the life time of the nonvolatile memory is shorter than that of the volatile memory. In a process of using a nonvolatile memory capable of accessing data in units of bits, when a large number of specific bits in which errors occur are generated, a situation may arise in which the nonvolatile memory itself should be discarded. Accordingly, in order to protect user's data, it is necessary to identify the states associated with the error-occurring bits in the nonvolatile memory and monitor overall health status of the nonvolatile memory, before the occurrence of the situation in which the nonvolatile memory should be discarded.

SUMMARY

A nonvolatile memory system according to an embodiment of the present disclosure may be provided. The nonvolatile memory system may include a nonvolatile memory device, a delegate page attacker, and a health status analyzer. The nonvolatile memory device may include at least one memory block including a plurality of storage pages and a delegate page. The delegate page attacker may be configured to attack a bit of the delegate page at the same corresponding location as the bit of the storage page in which an error occurs. The health status analyzer may be configured to perform write and read operations for the delegate page and analyze error information occurred in the write and read operations to determine whether the nonvolatile memory device is in a failure status.

A method of identifying the overall health status of a nonvolatile memory system according to an embodiment of the present disclosure may be provided. The method may include configuring at least one memory block of a nonvolatile memory device to include a plurality of storage pages and a delegate page. The method may include attacking a bit of the delegate page at the same corresponding location as a bit of the storage page in which an error occurs, when the error occurs in write and read operations for the storage page of the nonvolatile memory device. The method may include identifying the overall health status of the nonvolatile memory device by performing write and read operations for the delegate page and analyzing error information generated in the write and read operations.

A nonvolatile memory system according to an embodiment of the present disclosure may be provided. The nonvolatile memory system may include a nonvolatile memory device including at least one memory block including a plurality of storage pages and a delegate page. The nonvolatile memory system may include a memory controller configured to determine whether the nonvolatile memory device is in a failure status through status analyzation for the delegate page rather than for each of the storage pages in the memory block.

A method of identifying a status of a nonvolatile memory system may be provided. The method of identifying the status of the nonvolatile memory system may include configuring at least one memory block of a nonvolatile memory device to include a plurality of storage pages and a delegate page. The method of identifying the status of the nonvolatile memory system may include determining whether the nonvolatile memory device is in a failure status through status analyzation for the delegate page rather than for each of the storage pages in the memory block.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Further, when an element is referred to as being "connected" or "coupled" to another element, the element may be electrically or mechanically connected or coupled to the other element directly, or may form a connection relationship or coupling relationship by replacing the other element therebetween.

Various embodiments may be directed to a nonvolatile memory system that is configured to use a delegate page to identify the overall health status of the nonvolatile memory system while requiring fewer hardware resources, and a method of identifying the overall health status of the nonvolatile memory system.

Figure 1:
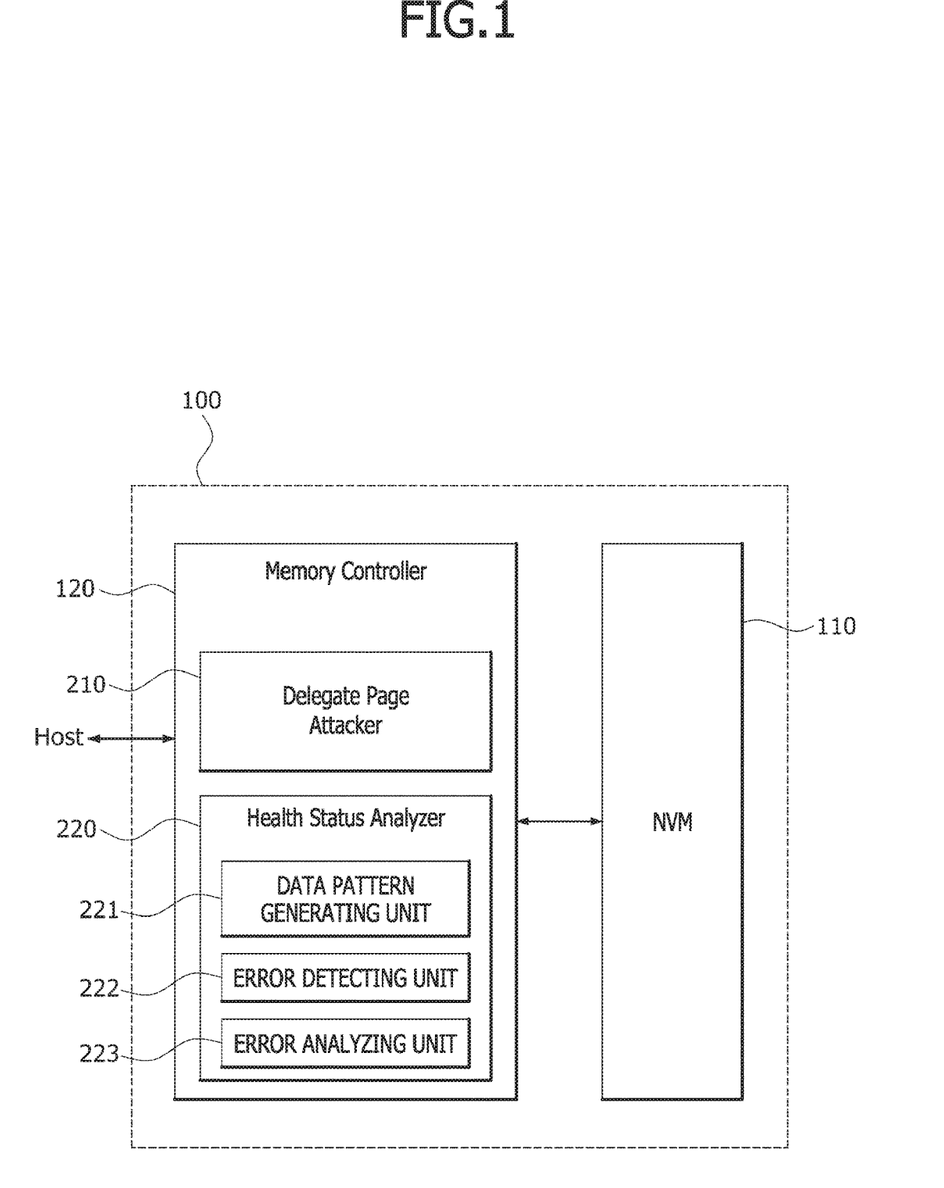
FIG. 1 is a block diagram illustrating a nonvolatile memory system according to an embodiment of the present disclosure.
Figure 2:
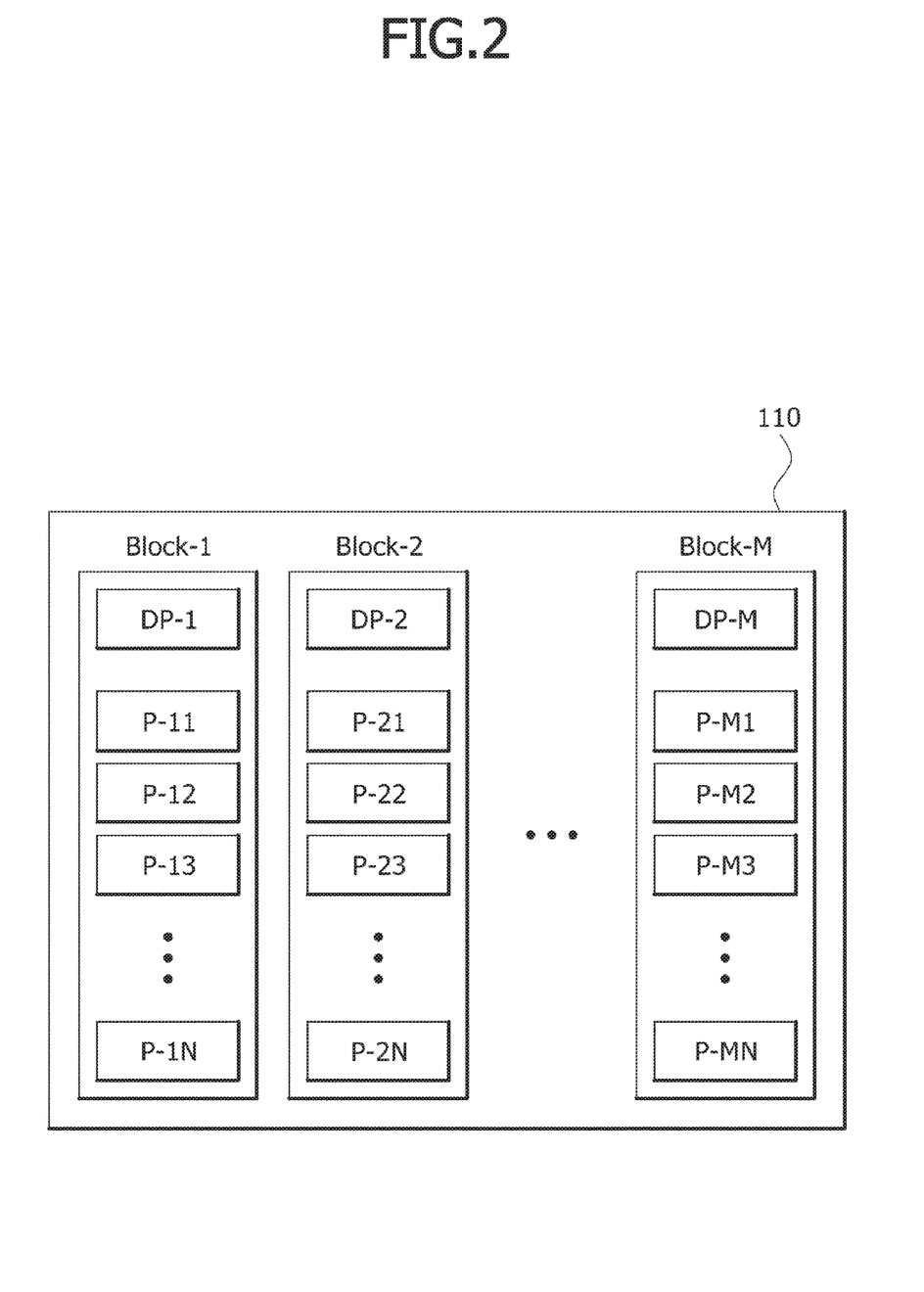
FIG. 2 is a view illustrating an internal configuration of the nonvolatile memory system of FIG. 1.

FIG. 1 is a block diagram illustrating a nonvolatile memory system 100 according to an embodiment of the present disclosure. FIG. 2 is a view illustrating an internal configuration of the nonvolatile memory system 100 of FIG. 1. Referring to FIG. 1, the nonvolatile memory system 100 may include a nonvolatile memory device 110 and a memory controller 120. In an embodiment, the nonvolatile memory device 110 may be a nonvolatile memory device capable of accessing in units of bits (or in units of cells) such as PRAM, FRAM, MRAM, nano floating gate memory (NFGM), polymer RAM or the like. Referring to FIG. 2, the nonvolatile memory device 110 may include a plurality of blocks, for example, M number of blocks Block-1, Block-2, . . . , and Block-M (where M may be a natural number). In an embodiment, for example, the blocks, for example, M number of blocks Block-1, Block-2, . . . , and Block-M may be memory blocks. The nonvolatile memory device 110 according to an embodiment may be a single chip. Each of the blocks may include one delegate page and N storage pages (where N may be a natural number). For example, a first block Block-1 may include a first delegate page DP-1 and N first storage pages P-11, P-12, P-13, . . . , and P-1N. A second block Block-2 may include a second delegate page DP-2 and N second storage pages P-21, P-22, P-23, . . . , and P-2N. An M-th block Block-M may include an M-th delegate page DP-M and N M-th storage pages P-M1, P-M2, P-M3, . . . , and P-MN.

Each of the delegate pages DP-1, DP-2, . . . , and DP-M may have the same memory cell structure as each of the storage pages in the block to which each the delegate page belongs. For example, the first delegate page DP-1 of the first block Block-1 may have the same memory cell structure as each of the first storage pages P-11, P-12, P-13, . . . , and P-1N of the first block Block-1. Accordingly, a capacity of each of the storage pages P-11, P-12, P-13, . . . , and P-1N and a capacity of the delegate page DP-1 are substantially the same. In case that bit data is written to or read from a first location (i.e., a first unit cell) of any one of the storage pages-11, P-12, P-13, . . . , and P-1N, an operation of writing or reading the bit data in the same location as the first position in the delegate page DP-1 may be performed under substantially the same conditions as the storage page.

Referring FIG. 1 again, the memory controller 120 may control an operation of writing data to the nonvolatile memory device 110 or an operation of reading data from the nonvolatile memory device 110 in response to a write and read (write/read) command from a host Host. The memory controller 120 may also perform a series of control operations to identify the overall health status of the nonvolatile memory device 110. In order to perform such control operations, the memory controller 120 may include a delegate page attacker 210 and a health status analyzer 220.

The delegate page attacker 210 may, when an error occurs in a specific bit of a storage page during a normal data write or read operation for the storage page of the nonvolatile memory device 110, attack a bit of the storage page of the delegate page in the same block, which is the same as the bit in which the error occurred. Thus, errors occurring during normal data write and read operations for the storage page are reflected substantially equally to the same location of the delegate page.

The health status analyzer 220 may analyze error information generated in the write and read operation of the delegate page to identify the overall health status of the nonvolatile memory device NVM 110. To this end, the health status analyzer 220 may include a data pattern generating unit 221 generating a data pattern, an error detecting unit 222 detecting an error generated during data pattern write and read operations for the delegate page, an error analyzing unit 223 analyzing the error detected by the error detecting unit 222 to identify the overall health status of the nonvolatile memory device 110. The operation of the health status analyzer 220 will be described below while explaining the health status analyzing method described below.

In the nonvolatile memory system 100 according to an embodiment, the overall health status of the nonvolatile memory device can be determined through the hardware resources of the delegate page attacker 210 and the health status analyzer 220. That is, in a block having a plurality of storage pages, a delegate page of the same capacity as each of the storage pages is allocated and the status of the delegate page is linked to the error occurrence status of each of the storage pages, thereby determining the overall health status of the volatile memory device 110 through status analyzation for the delegate page. Accordingly, there is provided an advantage of being able to determine the overall health status of the nonvolatile memory device 110 through a relatively small amount of hardware resources as compared to a method of monitoring the error occurrence status independently for each of the storage pages in each block of the nonvolatile memory device 110 or a general method of storing error-related information separately.

Figure 3:
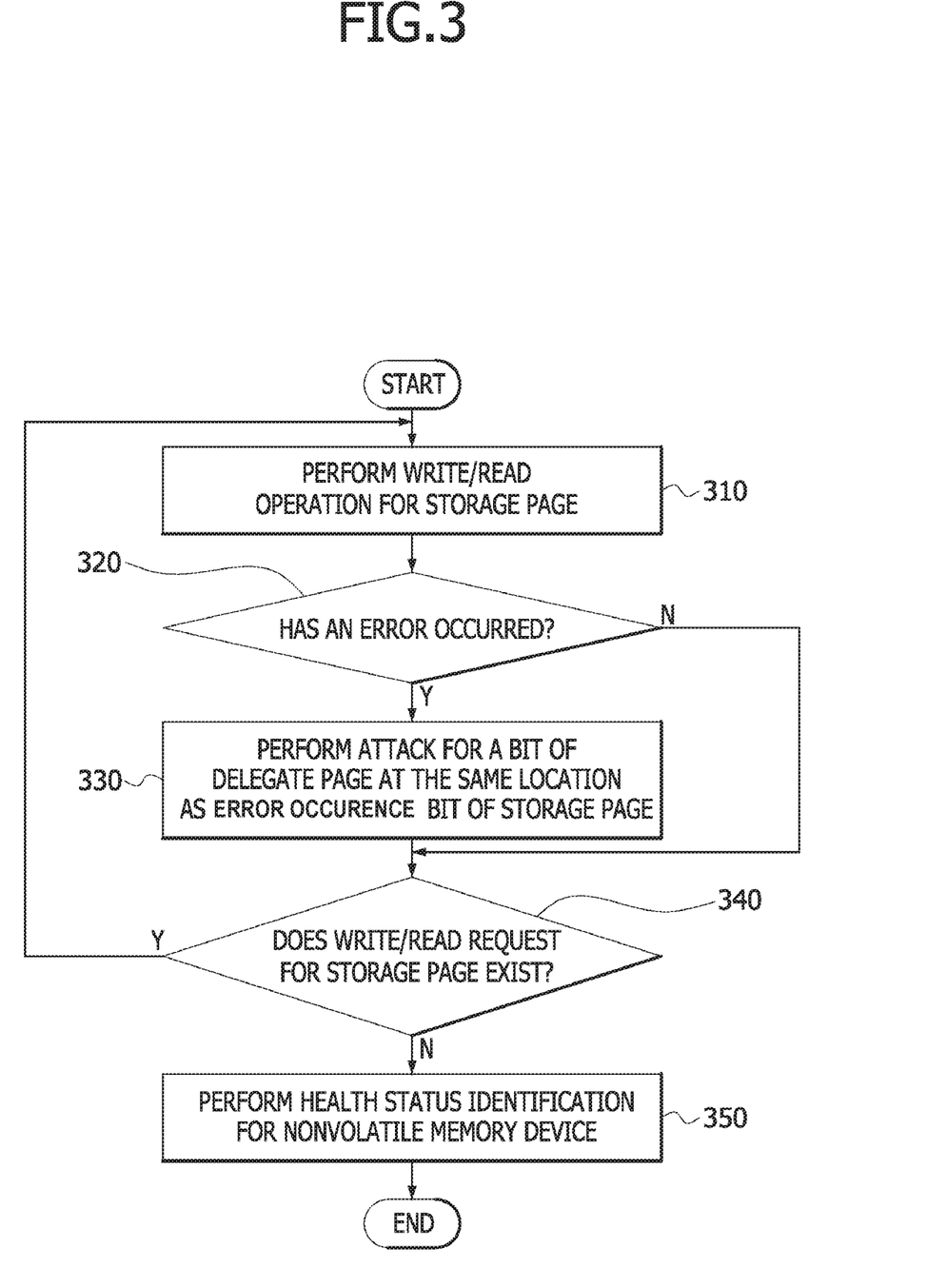
FIG. 3 is a flow chart illustrating a method of identifying the health status of a nonvolatile memory system according to an embodiment of the present disclosure.
Figure 4:
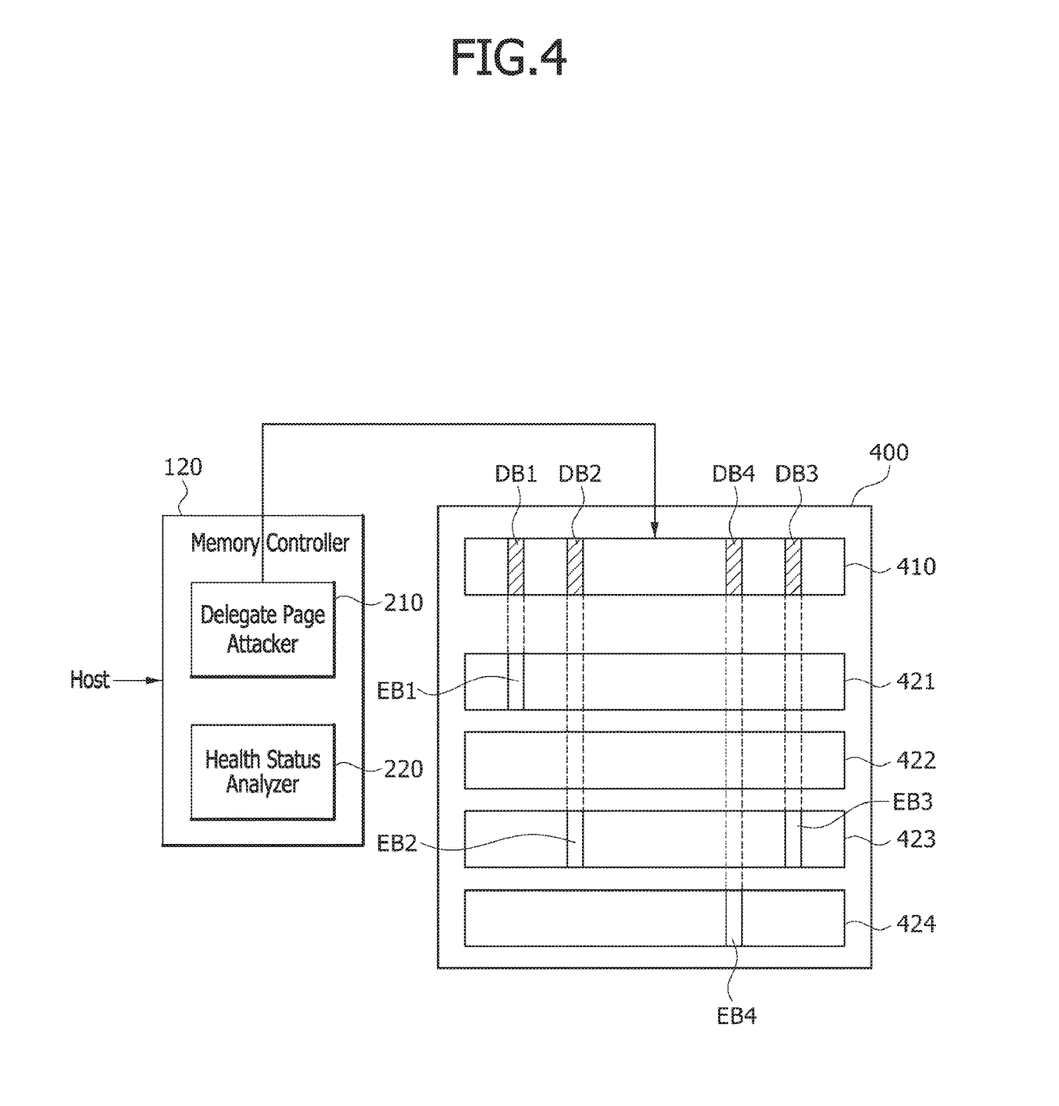
FIG. 4 is a block diagram illustrating a delegate page attack step in the method of identifying the health status of the nonvolatile memory system of FIG. 3.

FIG. 3 is a flow chart illustrating a method of identifying the overall health status of a nonvolatile memory system according to an embodiment of the present disclosure. FIG. 4 is a block diagram illustrating a delegate page attack step in the method of identifying the overall health status of the nonvolatile memory system of FIG. 3. Referring to FIG. 3 with FIGS. 1 and 2, a write/read operation for the storage pages of the nonvolatile memory device 110 may be performed (step 310). This step may be performed by a normal write/read command from the host. In an embodiment, this step may be performed during a wear-leveling process for the nonvolatile memory device 110, which is performed by an algorithm of the memory controller 120 itself. In step 310, any one of the M blocks Block-1, Block-2, . . . , and Block-M of the nonvolatile memory device 110 may be selected as a target block of the data write/read operation by a block address transmitted from the host. Also, any one of the N storage pages of the target block may be selected as a target storage page of the date write/read operation by the page address transmitted from the host. Unit cells to be subjected to the data write/read operation in the target storage page may be selected by the data address transmitted from the host.

Next, it may be determined whether an error has occurred in the write/read operation for the storage page of the nonvolatile memory device 110 (step 320). Determination as to whether an error has occurred may be performed through an error correction code (hereinafter referred to as "ECC") in the memory controller 120. As is well known, the ECC can identify whether an error has occurred through an ECC encoding process for write data and an ECC decoding process for read data, and identify an error location when an error has occurred. As a result of the determination in step 320, if it is determined that no error has occurred, step 340 may be performed. As a result of the determination in step 320, if it is determined that an error has occurred, an attack process for the delegate page may be performed (step 330).

Step 330 will be described with reference to FIG. 4. Referring to FIG. 4, a nonvolatile memory device 400 will now be described as having four storage pages 421-424 and one delegate page 410. If an error occurs in a first bit EB1 during a normal data write/read operation for the first storage page 421, a delegate page attacker 210 of a memory controller 120 may perform an attack operation with respect to the delegate page 410 bit DB1 of the same corresponding location as the first bit EB1 of the first storage page 421 among the bit areas of the delegate page 410. In an embodiment, the attack operation may be performed using a flip technique. The flip technique is a method of performing a write operation after inverting all the data values to be newly written, when the data values to be newly written are compared with the existing memory values and then half or more bits are different from each other. That is, the attack operation may be performed by performing a write operation to invert the value stored in the attack target bit DB1 of the delegate page 410. In an embodiment, the attack operation may be implemented through an operation of writing specific data, for example, "1" or "0" for the attack target bit DB1 of the delegate page 410 without applying the flip technique.

The write operation for attacking the delegate page may be performed once, but may be performed a plurality of times. The number of the write operations for a delegate page attack may be determined under conditions that allow a subsequent health status determination to be appropriately made through a pre-performed test procedure. For example, when the write operation is performed 10 times, the error level of a bit DB1 of the same location of the delegate page 410 is lower than the error level of the first bit EB1 of the first storage page 421. On the other hand, when the write operation is performed 12 times, the error level of the bit DB1 of the same location of the delegate page 410 is higher than the error level of the first bit EB1 of the first storage page 421. Accordingly, for example, the number of the write operation for the attack operation can be determined to be 11 times.

When errors occur in a second bit DB2 and a third bit DB3 in a normal data write/read operation for the third storage page 423, the delegate page attacker 210 of the memory controller 120 may perform attack operations for bits DB2 and DB3 located at the same corresponding locations as a second bit EB2 and a third bit EB3 of the bit areas of the delegate page 410, respectively. Similarly, when an error occurs in a fourth bit EB4 in a normal data write/read operation for the fourth storage page 424, the delegate page attacker 210 of the memory controller 120 may perform an attack operation for a bit DB4 located at the same location as the fourth bit EB4 of the bit areas of the delegate page 410. As described above, all the bit locations and error levels of the error bits occurred in the data write/read operations for the first storage page 421, the third storage page 423, and the fourth storage page 424 are reflected in the bits of the same locations of the delegate page 410.

After performing the delegate page attack in step 330, the memory controller 120 may determine whether there is a write/read request for the storage page (step 340). That is, the memory controller 120 may determine whether the nonvolatile memory device 400 is in an idle status. As a result of determination of operation 340, if there is a write/read request for the storage page, step 310 may be performed to perform a normal write/read operation for the storage page. On the other hand, as a result of determination of step 340, if there is not a write/read request for the storage page, that is, when the nonvolatile memory 400 is in an idle status, operation of identifying the health status of the nonvolatile 400 may be performed (operation 350).

Figure 5:
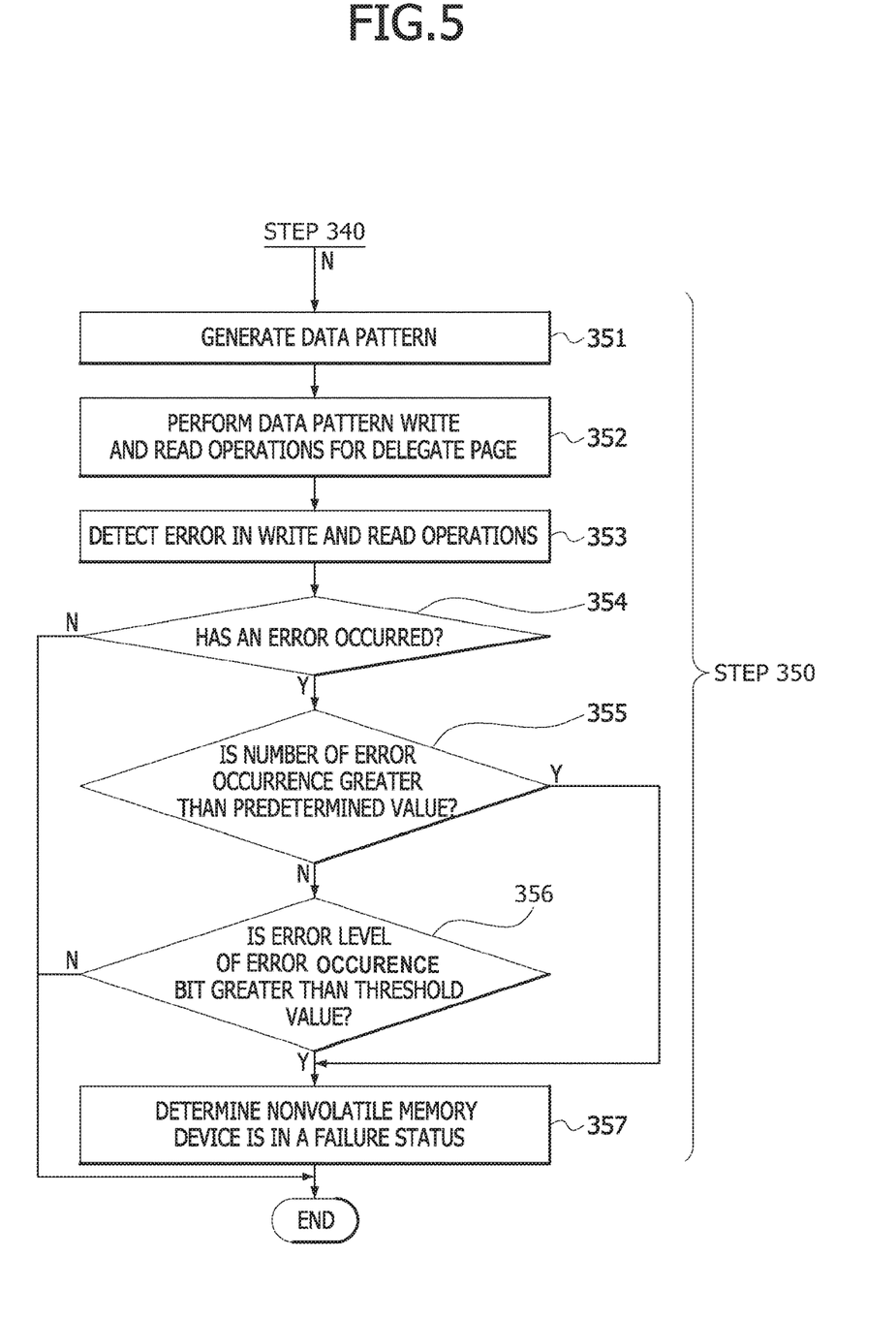
FIG. 5 is a flow chart illustrating step 350 in the method of identifying the health status of the nonvolatile memory system of FIG. 3.
Figure 6:
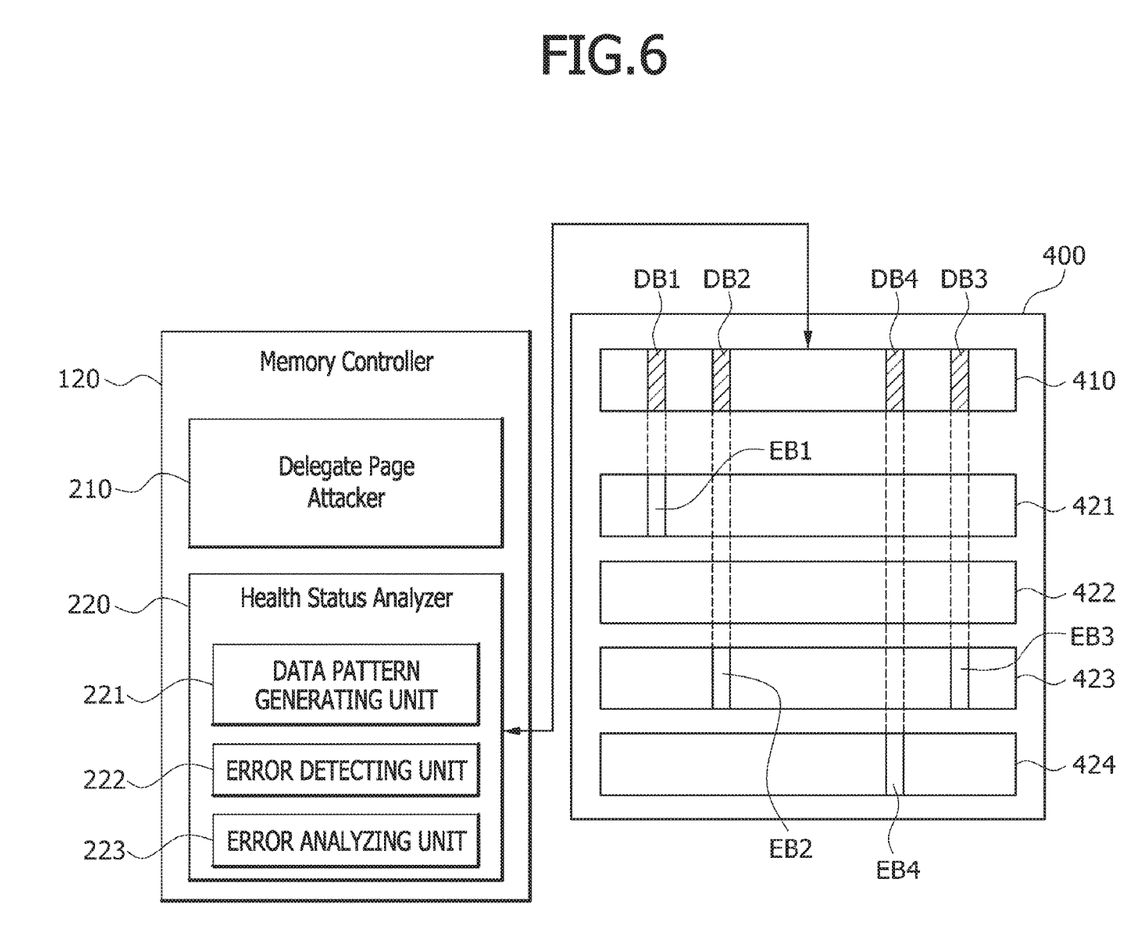
FIG. 6 is a block diagram illustrating step 350 in the method of identifying the health status of the nonvolatile memory system of FIG. 3.

FIG. 5 is a flow chart illustrating step 350 in the method of identifying the overall health status of the nonvolatile memory system of FIG. 3. FIG. 6 is a block diagram illustrating step 350 in the method of identifying the overall health status of the nonvolatile memory system of FIG. 3. Referring to FIGS. 5 and 6, in order to identify the health status of the nonvolatile memory system, a data pattern may be generated (step 351). The data pattern may be generated by the data pattern generating unit 221 of the health status analyzer 220. The data pattern may be randomly configured, but may have a certain value, for example, a constant binary value of "0" or "1".

Next, an operation of writing and reading (writing/reading) the data pattern for the delegate page may be performed (step 352). For example, when a data pattern is generated by the data pattern generating unit 221, the memory controller 120 may perform operations of writing and reading the data pattern for all areas of the delegate page 410. For example, if the data pattern is a binary data stream consisting only of a value of "0" (or "1"), the value "0" (or "1") may be written for all bits of the delegate page 410, and, when the write operation is ended, read operations for all bits of the delegate page 410 may be performed. This process can be applied equally to a case where the data pattern is a randomly configured binary data stream. In the process of writing and reading the data pattern for the delegate page 410, the memory controller 120 may temporarily stop the ECC operation so that error correction by the ECC operation is not performed.

Next, detect error of the data pattern for the delegate page 410 in process of writing and reading (step 353). Next, whether an error has occurred in the process of writing and reading the data pattern for the delegate page 410 may be determined (step 354). Since the error correction has not performed during the writing and reading the data pattern for the delegate page 410, the occurrence or non-occurrence of an error may be determined according to the status of the cell array and the unit cell of the delegate page 410. If an error has not occurred in step 354, it is determined that the nonvolatile memory device 400 is in a normal state, and the operation of identifying the health status of the nonvolatile memory system may be ended. On the other hand, if an error has occurred in step 354, whether the number of error occurrence bits is greater than a predetermined value may be determined (step 355).

If the number of the error occurrence bits is determined to be greater than the predetermined value in step 355, the process proceeds to step 357 to finally determine whether the nonvolatile memory device 400 has failed. On the other hand, if the number of error occurrence bits is determined not to be greater than the predetermined value in step 355, whether the error level of the error occurrence bit exceeds a threshold value th may be determined (step 356). In an embodiment, a current flowing in the bit cell may be sensed and the error level of the error occurrence bit may be divided into a plurality of levels according to an amount of the sensed current. In an embodiment, in case that the error level of the error occurrence bit exceeds the threshold value th, this may mean that the data write and read operations have not performed on the error occurrence bit. If the error level of the error occurrence bit exceeds the threshold value th in the determination of step 356, the process may proceed to step 357 to finally determine whether the nonvolatile memory device 400 has failed. On the other hand, if the error level of the error occurrence bit does not exceed the threshold value th in the determination of step 356, the nonvolatile memory device 400 may be determined to maintain the normal status and the health status determination operation may be ended.

Determination of operation 355 and determination of step 356 may be performed by the error analyzing unit 223. When the number of the error occurrence bits is greater than the preconfigures value in step 355 and the error level of the error occurrence bit exceeds the threshold value th in the determination of step 355, the error analysis unit 223 may determine that the nonvolatile memory device 400 is in a failure status (step 357). In other words, when the number of the error occurrence bits is greater than the predetermined value, it is the case that the defective unit cells are generated above the predetermined value in at least one of the storage pages 421 to 424 or in most storage pages. This means that the nonvolatile memory device 400 may not operate normally. Therefore, in this case, the error analyzing unit 223 may determine that the nonvolatile memory device 400 is in a failure status, and alert the user to prevent data loss due to abnormality of a storage medium. Similarly, even if the number of the error occurrence bits is less than the predetermined value, if the error level of the error occurrence bits exceeds the threshold value th, it is the case that the defective unit cells of at least one of the storage pages 421-424 or most of the storage pages 421-424 are severely damaged. Even in this case, the nonvolatile memory device 400 may not operate normally. Therefore, in this case also, the error analyzing unit 223 may determine that the nonvolatile memory device 400 is in a failure status, and alert the user to prevent data loss due to abnormality of a storage medium.

As described above with reference to FIG. 4, in the normal write/read operation for the nonvolatile memory device 400, for example, when errors occur in the error occurrence bits EB1, EB2, EB3 and EB4 of the storage pages 421, 423 and 424, the bits DB1, DB2, DB3, and DB4 of the delegate page 410 that correspond to the error occurrence bits EB1, EB2, EB3, and EB4 are all in an attacked status. Therefore, in the process of writing and reading the data pattern for the delegate page 410, the error detecting unit 222 detects errors occurring in the bits DB1, DB2, DB3, and DB4 of the delegate page 410. In this case, the number of the error occurrence bits is detected by the error detecting unit 222 as, for example, 4 bits.

In an embodiment, when the predetermined value used in step 355 is, for example, 3 bits, the error analyzing unit 223 may compare the 4 bits, which is the number of the detected error occurrence bits, with 3 bits, which is the predetermined value, and finally determine that the nonvolatile memory device 400 is in a failure status. In an embodiment, when the predetermined value used in step 355 is, for example, 5 bits, the error analyzing unit 223 may compare the 4 bits, which is the number of the detected error occurrence bits, with 5 bits, which is the predetermined value, and perform the determination process of step 356. In an embodiment, if it is determined in step 356 that the error level of the nonvolatile memory device 400 is such that data write and read operations are not performed on at least any one of the error occurrence bits DB1-DB4, the error analyzing unit 223 may finally determine that the nonvolatile memory device 400 is in a failure state or has a failure status.

The embodiments of the concepts have been disclosed above for illustrative purposes. Those of ordinary skill in the art will appreciate that various modifications, additions, and substitutions are possible, without departing from the scope and spirit of the concepts as disclosed in the accompanying claims.

What is claimed is:

1. A nonvolatile memory system comprising:
   a nonvolatile memory device including at least one memory block including a plurality of storage pages and a delegate page;
   a delegate page attacker configured for attacking a bit of the delegate page at the same corresponding location as a bit of the storage page in which an error occurs; and
   a health status analyzer configured for performing write and read operations for the delegate page and analyzing error information occurred in the write and read operations to determine whether the nonvolatile memory device is in a failure status.

2. The nonvolatile memory system of claim 1, wherein the nonvolatile memory device is a nonvolatile memory device capable of accessing in units of bits.

3. The nonvolatile memory system of claim 1, wherein each of the storage pages in the memory block to which the delegate page is included and the delegate page include substantially the same memory cell structure.

4. The nonvolatile memory system of claim 1, wherein each of the storage pages in the memory block to which the delegate page is included and the delegate page include the same storage capacity.

5. The nonvolatile memory system of claim 1, wherein the nonvolatile memory device includes a plurality of memory blocks, and each of the memory blocks has the storage pages and the delegate page.

6. The nonvolatile memory system of claim 1, wherein attacking the bit of the delegate page by the delegate page attacker includes repeatedly performing a write operation for inverting a value stored for the bit of the delegate page at the same location as the bit of the storage page in which the error occurred.

7. The nonvolatile memory system of claim 1, wherein attacking the bit of the delegate page by the delegate page attacker includes repeatedly performing a write operation for writing specific data to the bit of the delegate page at the same corresponding location as the bit of the storage page in which the error occurred.

8. The nonvolatile memory system of claim 1, wherein the health status analyzer performs when the nonvolatile memory device is in an idle status.

9. The nonvolatile memory system of claim 1, wherein the health status analyzer comprises:
   a data pattern generating unit generating a data pattern for performing write and read operations for the delegate page;
   an error detecting unit detecting an error generated in a process of writing and reading the data pattern for the delegate page; and
   an error analyzing unit analyzing the error detected by the error detecting unit to determine whether the nonvolatile memory device is in a failure status.

10. The nonvolatile memory system of claim 9, wherein the data pattern is randomly configured or composed of a constant binary value of "0" or "1".

11. The nonvolatile memory system of claim 9, wherein the error detecting unit performs detecting the error in a state in which error correction is interrupted.

12. The nonvolatile memory system of claim 9, wherein the error analyzing unit analyzes a number of bits and a degree of the error detected by the error detecting unit and determines whether the nonvolatile memory device is in a failure status.

13. A method of identifying an overall health status of a nonvolatile memory system comprising:
    configuring at least one memory block of a nonvolatile memory device to include a plurality of storage pages and a delegate page;
    attacking a bit of the delegate page at the same corresponding location as a bit of the storage page in which an error occurs, when the error occurs in write and read operations for the storage page of the nonvolatile memory device; and
    identifying the overall health status of the nonvolatile memory device by performing write and read operations for the delegate page and analyzing error information generated in the write and read operations.

14. The method of identifying an overall health status of a nonvolatile memory system of claim 13, wherein the nonvolatile memory device is capable of accessing in units of bits.

15. The method of identifying an overall health status of a nonvolatile memory system of claim 13, wherein each of the storage pages and the delegate page include substantially the same memory cell structure.

16. The method of identifying an overall health status of a nonvolatile memory system of claim 13, wherein attacking a bit of the delegate page includes repeatedly performing a write operation of inverting a value stored for a bit of the delegate page at the same corresponding location as a bit of the storage page in which the error occurs.

17. The method of identifying an overall health status of a nonvolatile memory system of claim 13, wherein identifying the overall health status of the nonvolatile memory device is performed when the nonvolatile memory device is in an idle status.

18. The method of identifying an overall health status of a nonvolatile memory system of claim 13, wherein identifying the overall health status of the nonvolatile memory device includes:
    generating a data pattern for performing write and read operations for the delegate page;
    detecting an error occurring in the write and read operations of the data pattern for the delegate page; and
    analyzing the detected error to identify the overall health status of the nonvolatile memory device.

19. The method of identifying an overall health status of a nonvolatile memory system of claim 18, wherein the data pattern is randomly configured or composed of a constant binary value of "0" or "1".

20. The method of identifying an overall health status of a nonvolatile memory system of claim 18, wherein analyzing the detected error is performed in a state in which error correction is interrupted.

21. The method of identifying an overall health status of a nonvolatile memory system of claim 19, wherein analyzing the detected error is performed by analyzing a number of bits and a degree of the detected error to identify the overall health status of the nonvolatile memory device.

\* \* \* \* \*